(12) United States Patent
Doumae

(10) Patent No.: US 6,803,288 B2
(45) Date of Patent: Oct. 12, 2004

(54) METHOD OF MANUFACTURING FIELD EFFECT TRANSISTOR

(75) Inventor: Yasuhiro Doumae, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 87 days.

(21) Appl. No.: 10/043,237

(22) Filed: Jan. 14, 2002

(65) Prior Publication Data

US 2003/0013243 A1 Jan. 16, 2003

(30) Foreign Application Priority Data

Jul. 16, 2001 (JP) ........................................ 2001-214613

(51) Int. Cl.[7] ............................................ H01L 21/336
(52) U.S. Cl. ........................ 438/302; 438/303; 438/305
(58) Field of Search ................................ 438/197, 525, 438/289, 230, 290, 301, 302, 303, 305, 527, 519

(56) References Cited

U.S. PATENT DOCUMENTS

| | | | | |
|---|---|---|---|---|
| 4,198,250 A | * | 4/1980 | Jecmen ........................ | 438/301 |
| 5,409,848 A | * | 4/1995 | Han et al. .................... | 438/302 |
| 5,837,588 A | * | 11/1998 | Wu ............................. | 438/305 |
| 5,866,448 A | * | 2/1999 | Pradeep et al. ............. | 438/231 |
| 5,869,378 A | * | 2/1999 | Michael ...................... | 438/305 |
| 6,087,706 A | * | 7/2000 | Dawson et al. ............. | 257/520 |
| 6,352,885 B1 | * | 3/2002 | Wieczorek et al. ......... | 438/197 |
| 2002/0068395 A1 | * | 6/2002 | Tran et al. ................... | 438/194 |
| 2003/0075806 A1 | * | 4/2003 | Reber .......................... | 257/773 |

OTHER PUBLICATIONS

"A Novel Self–aligned Gate–overlapped LDD Poly–Si TFT with High Reliability and Performance", published in the IEEE in 1977 and authored by Mutsuko Hatano, Hajime Akimoto and Takeshi Sakai.*

A Novel Self–aligned Gate–overlapped LDD Poly–Si TFT with High Reliability and Performance, published in the IEEE in 1977 and authored by Mutsuko Hatano, Hajime Akimoto and Takeshi Sakai.*

* cited by examiner

Primary Examiner—Tuan H. Nguyen
Assistant Examiner—William Vesperman
(74) Attorney, Agent, or Firm—Volentine Francos, PLLC

(57) ABSTRACT

A method for manufacturing a field effect transistor (FET) which is capable of effectively inhibiting an expansion of a depletion layer between a source and a drain in the FET, without causing variations in electrical characteristics, at a comparatively low impurity concentration. After a conductive layer for a gate electrode has been formed on a semiconductor substrate, in order to remove unwanted portions from the conductive layer by lithography, an etching mask is formed at locations corresponding to the gate electrode and, by using the etching mask as a mask for ion implantation, an impurity is implanted to form an impurity region in a predetermined region of a semiconductor substrate existing under the conductive layer.

19 Claims, 5 Drawing Sheets

METHOD OF MANUFACTURING FIELD EFFECT TRANSISTOR

BACKGROUND OF THE INVENTION

1. Field of the Invention

The present invention relates to a method for manufacturing a field effect transistor (FET) such as a MOS (Metal Oxide Semiconductor) transistor.

2. Description of the Related Art

In the MOS transistor, with a voltage being applied between a source and a drain being made up of a pair of impurity regions and each being formed at intervals on both sides of a gate electrode formed on a semiconductor substrate, a drain current can be calibrated by controlling a gate voltage to be applied to the gate electrode. When the voltage is applied between the source and the drain, a depletion layer expands in a direction from the drain to the source. Since an excessive expansion of the depletion layer causes a decrease in a threshold voltage of the MOS FET, in order to inhibit the excessive expansion of the depletion layer, an attempt is being made in which, between a pair of first impurity regions each making up the source and drain respectively, a pair of second impurity regions exhibiting a conductive property being reverse to that in the first impurity regions is formed.

Each impurity region making up the pair of the second impurity regions expands from a position of each of the tip portions of the pair of the first impurity regions in a direction that the two impurity regions making up the second impurity regions come closer to one another beneath the gate electrode. Since serial and continued formation of the pair of the second impurity regions causes a decrease in the drain current, to prevent such the decrease in the drain current, each of the pair of the second impurity regions is placed at intervals in a manner so as to avoid such the serial formation. However, in order to obtain a comparatively high effect of inhibiting the expansion of the depletion layer at a low impurity concentration, it is desirous that the depletion layer expands directly beneath the gate electrode as much as possible.

To achieve this, conventionally, when the second impurity regions are formed, after the gate electrode has been formed, an impurity is implanted at predetermined places in the semiconductor substrate using the gate electrode as a selective mask. Moreover, in order to expand the second impurity regions as much as possible beneath the gate electrode, the impurity used to form the second impurity regions is implanted at an angle formed by a line heading from an obliquely upward direction of the gate electrode to the downward direction of the gate electrode and a line being vertical to a surface of the semiconductor substrate in a manner that the angle of depression becomes narrow, that is, in a manner that the angle of implanting the impurity becomes wide in relative to a line being vertical to a surface of the semiconductor substrate.

However, if a plurality of the gate electrodes is formed in parallel, since the second impurity regions are expanded comparatively long, when the angle of implanting the impurity is set to be wide, adjacent gate electrodes shade each other and, if the interval between the gate electrodes is different, each transistor is shaded by the gate electrode, thus causing variations in the impurity concentration of the second impurity regions and in electrical characteristics of each transistor.

Therefore, in the conventional method of manufacturing the FET, it is not easy to produce the FET in which the expansion of the depletion layer between the source and drain has been effectively inhibited by implantation of the ion at a comparatively low impurity concentration.

SUMMARY OF THE INVENTION

In view of the above, it is an object of the present invention to provide a method of manufacturing an FET which is capable of effectively inhibiting an expansion of a depletion layer between a source and a drain in the FET without causing variations in electrical characteristics.

It is another object of the present invention to provide the method of manufacturing the FET which is capable of effectively inhibiting the depletion layer at a comparatively low impurity concentration.

According to a first aspect of the present invention, there is provided a method of manufacturing an FET having a gate electrode formed on a semiconductor substrate, with a main surface, the method including:

forming a conductive layer on the main surface via a dielectric film;

forming a gate electrode by etching the conductive layer using a mask formed thereon;

forming a source region and a drain region in the main surface; and forming pocket regions in the semiconductor substrate by implanting ion using the mask.

According to a second aspect of the present invention, there is provided a method of manufacturing an FET having a method of manufacturing a field effect transistor having a semiconductor substrate with a main surface, comprising;

forming a conductive layer on the main surface via a dielectric film;

forming a mask on the conductive layer;

forming pocket regions in the semiconductor substrate by implanting ion using the mask;

forming a gate electrode by etching the conductive layer using the mask;

forming a source region and a drain region in the main surface using the gate electrode as a mask; and wherein the pocket regions underlying the source and drain regions.

In the foregoing, a preferable mode is one wherein the mask has a desired width to define a gate length and wherein an ion is implanted at an angle formed by a line heading from an obliquely upward direction of the mask to a downward portion of the mask and then to an inside of the semiconductor substrate and a line being vertical to a surface of the semiconductor substrate.

Also, a preferable mode is one wherein the mask has a width being less than a desired width defining a gate length and wherein the ion is implanted at a right angle formed by a line heading from an upward direction of the mask to the inside of the semiconductor substrate and a line being vertical to the surface of the semiconductor substrate.

Also, a preferable mode is one wherein side walls are formed on the mask, after the ion implantation, to substantially provide the desired width to the gate electrode and, by using the mask containing the side walls as a resist mask, unwanted portion is removed from the conductive layer and the gate electrode defining a predetermined gate length is formed.

Furthermore, a preferable mode is one wherein, after the ion implantation using the mask, by performing etching processing using the etching mask as a resist mask, the gate electrode whose width is increased along the downward direction to secure the predetermined gate length.

With the above configurations, prior to the formation of the gate electrode, the impurity used to form the pocket regions is implanted by using the etching mask used to form the gate electrode as the selective mask. The selective mask prevents the pair of pocket regions from being formed in a serial and continued manner. Moreover, since the conductive layer formed under the selective mask is in a state before being formed as the gate electrode, it exists in a serial and continued state irrespective of the state of intervals between the gate electrodes, the concentration of the ion to be implanted to form the pocket regions is not affected partially as in the gate electrode manufactured by the conventional method but influenced equally as a whole.

Furthermore, the selective mask can be a shading object in the oblique impurity implantation process, however, the selective mask is so disposed that a depth from a surface of the gate electrode to a predetermined point where the ion is implanted in the semiconductor substrate is larger by the thickness of the conductive layer compared with the depth in a structure of the FET manufactured by the conventional method. Therefore, even if the ion implantation is performed at the same angle as in the conventional method, it is possible to have the pocket region formed by the ion implantation beneath the gate electrode expand longer by the thickness of the conductive layer, compared with the FET manufactured by the conventional method. As a result, according to the present invention, the FET being excellent in inhibiting the expansion of the depletion layer can be comparatively easily manufactured, when compared with the conventional method. Moreover, it is possible to obtain the same effect of inhibiting the expansion of the depletion layer as in the conventional case even if the impurity concentration is lower than that employed in the conventional method and to comparatively easily manufacture the FET having no variations in electrical characteristics irrespective of the interval between the gate electrodes.

Furthermore, the etching mask can be formed so as to have a desired width defining the gate length and the ion is implanted at an angle formed by a line heading from an obliquely upward direction of the etching mask to a downward portion of the etching mask and then to an inside of the semiconductor substrate and a line being vertical to a surface of the semiconductor substrate.

Alternatively, it is possible to form the etching mask so as to have the width being less than the desired width defining the gate length. In this case, the ion is implanted at an almost right angle formed by a line heading from an upward direction of the etching mask to the inside of the semiconductor substrate and a line being vertical to the surface of the semiconductor substrate. Side walls are formed on the etching mask having the width being less than the desired width, after the ion implantation, to substantially provide the desired width to the gate electrode. By using the etching mask containing the side walls as a resist mask and by removing unwanted portion, the same gate electrode defining the predetermined gate length as in the conventional method is formed.

Furthermore, instead of forming the side walls using the etching mask having the width being less than the desired width after the ion implantation, the gate electrode of a tapered shape in which the width increases along the downward portion of the etching mask is formed which enables the predetermined gate length to be secured, by etching processing using the etching mask as the resist mask.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

Best modes of carrying out the present invention will be described in further detail using various embodiments with reference to the accompanying drawings.

First Embodiment

Figure 1A:
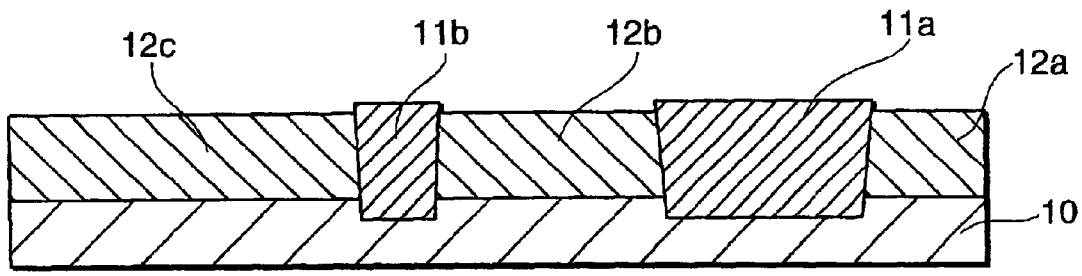
FIG. 1(a)–FIG. 1(e) show a process diagram explaining a method for manufacturing an FET according to a first embodiment of the present invention.

FIG. 1(a)–FIG. 1(e) show an example in which a method for manufacturing an FET of the present invention is applied to manufacturing of an nMOS transistor. As shown in FIG. 1(a), on a semiconductor substrate 10 made up of a P-type silicon substrate whose surface having, for example, (100) planes exists a plurality of active regions 12 (12a, 12b and 12c) partitioned by isolation regions 11 (11a and 11b). Though not shown in FIG. 1(a), the active region 12c shown in the leftmost in FIG. 1(a) expands to a rear of the element separating region 11a being disposed in the right in FIG. 1(a) and is partitioned by the element separating region 11a from the active region 12b. The element separating regions 11 can be formed by, for example, a conventionally well-known LOCOS (Local Oxidation Of Silicon) method, a trench method or a like.

Into each of the active regions 12 partitioned by the element separating region 11, if necessary, is implanted an impurity used to calibrate a threshold value by using an ion implantation method. As the impurity used to calibrate the threshold value, for example, a boron exhibiting the same P-conductive property as that of the semiconductor substrate 10 is used. The impurity, as is well known, maintains a threshold of the transistor at a designed appropriate value, by causing an impurity concentration in the active region 12 to become equally high.

Figure 1B:
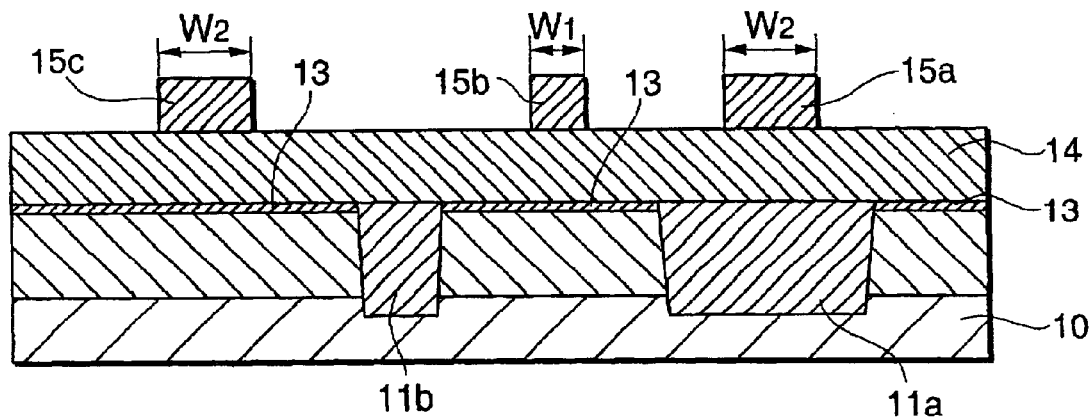

As shown in FIG. 1(b), a well-known gate oxide film 13 is formed on surfaces of the active regions 12 by performing oxidation process on a surface of the active region 12. After the formation of the gate oxide film 13, a conductive layer 14 for the gate electrode is formed in a manner so as to cover the gate oxide film 13 and the element separating region 11, for example, by a conventionally well-known CVD (Chemical Vapor Deposition) method.

On the conductive layer 14 are formed etching masks 15 (15a, 15b and 15c) used to remove unwanted portions from the conductive layer 14 and to form the gate electrode. The etching masks 15 can be formed by performing photolithography and etching processing on an insulating layer made of, for example, silicon dioxide stacked on the conductive layer 14. The etching masks 15 can be made up of a photoresist prepared by using the photolithography technology.

In the example shown in FIG. 1(b), of the three etching masks 15a, 15b and 15c, the etching mask 15b disposed at the center has a narrow width W1 and the etching masks 15a and 15c disposed at both the sides of the etching mask 15b have the same wide widths which are wider than the width W1. These width dimensions are set so as to be equal to desired gate lengths (that is, W1 or W2).

In the conventional technology as described in "Description of the Related Art", the ion implantation has been performed after the removal of the unwanted portions in the conductive layer 14 existing beneath the etching mask by selective etching processing using each of the etching masks 15 as the selective mask, however, in the present invention, prior to the selective etching processing on the conductive layer 14, the ion implantation is performed.

Figure 1C:
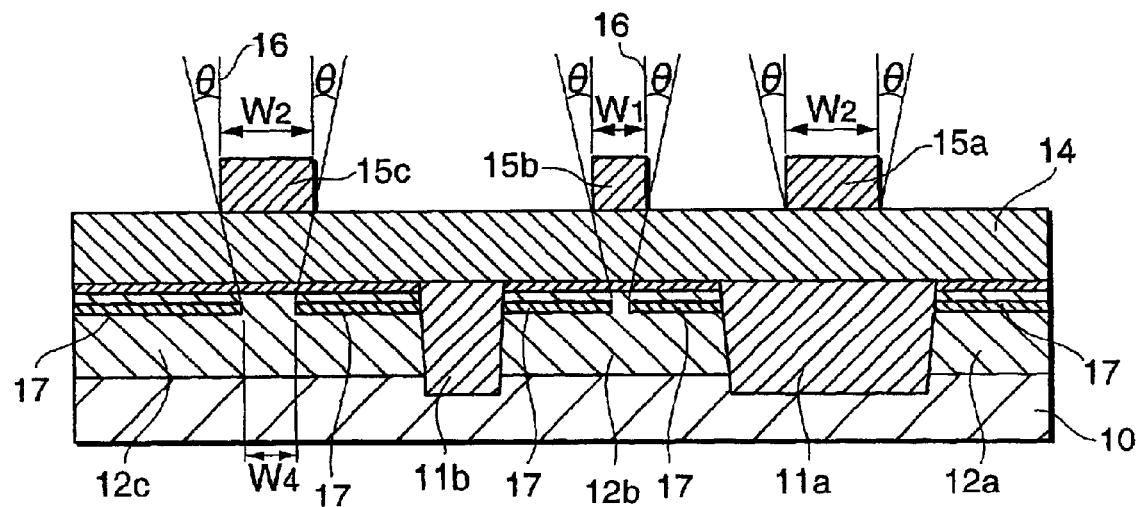

That is, as shown in FIG. 1(c), by using each of the etching masks 15 formed on the conductive layer 14 as the mask and by the ion implantation method, a P-type impurity such as boron is implanted from an upper left direction and from an upper right direction in FIG. 1(c) toward the semiconductor substrate 10. In FIG. 1(c), each of the angles θ of implanting the ion from both the directions is indicated by a crossing angle formed when a vertical line 16 on the semiconductor substrate 10 and the line indicating the implantation cross each other.

By a collective ion implantation to be performed from both the directions, a pair of the P-type impurity regions 17 is formed in each of the active regions 12 so as to correspond to each of the masks 15 and so as to exist beneath each of the masks 15 in the semiconductor substrate 10. Each of the pair of impurity regions 17 existing in each of the active regions 12 expands in a manner so as to come closer to each other from the direction of each of the element separating regions 11 and to come toward a center portion of each of the active regions 12 and is so configured that an interval being smaller than the width (W1 or W2) of each of the corresponding masks 15 exists between tips of each of the impurity regions 17 by the masking action.

In the method of the present invention, even if the angle θ of implanting the ion is the same as that in the conventional method, a depth from a surface of the conductive layer 14 serving as a face into which the ion is implanted to a point where the ion is implanted increases by a thickness of the conductive layer 14. The increase in the depth implies that each of the impurity region making up the pair of the impurity regions 17 expands longer at the center of each of the active regions 12 compared with the FET manufactured by the conventional method. Therefore, each of the intervals W3 and W4, even when the etching mask 15 having the same width as the width (W1 and W2) in the conventional case is used, is set so as to have a smaller width compared with that in the conventional case.

Figure 1D:
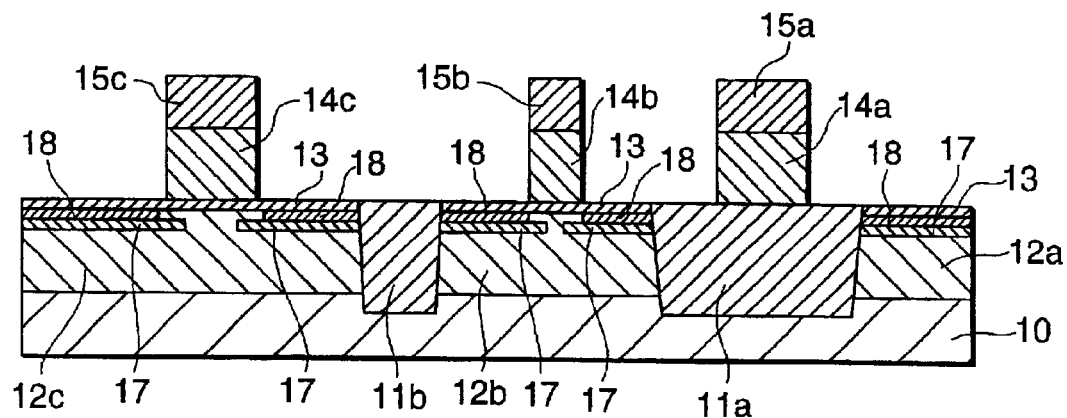

After the formation of the impurity region 17, as shown in FIG. 1(d), the well-known selective etching processing is performed on the conductive layer 14 using each of the etching masks 15 to remove unwanted portions being exposed from each of the etching masks 15. By the removal of the unwanted portions, each of the gate electrodes 14a, 14b and 14c is formed.

The unwanted portions of the gate oxide film 13 hang over in the active regions 12 from each of the gate electrodes 14a, 14b and 14c. By using the unwanted portions of the gate oxide film 13 as a passivation film, the impurity is implanted into both sides of each of the gate electrodes 14a, 14b and 14c by using the ion implantation method. As the impurity used in the implantation process, an n-type impurity such as arsenic having a conductive property being different from that of the semiconductor substrate 10 is used. By the implantation of the impurity, the same LDD (Lightly Doped Drain) regions 18 as in the conventional case are formed. The LDD region 18 serves to inhibit the occurrence of a hot carrier by field relaxation between the source and drain, as is well known. The process of the formation of the LDD region 18 can be made unnecessary.

Then, each of the etching masks 15 on each of the gate electrodes 14a, 14b and 14c is removed and side walls 19 are formed on both the sides of each of the gate electrode 14a, 14b and 14c. The side walls 19 can be formed, as is conventionally well-known, by incorporating each of the gate electrodes 14a, 14b and 14c therein by the CVD method using the insulating material and then by removing unwanted portions except portions making up the side wall 19 of the insulating material by the etching processing.

Figure 1E:
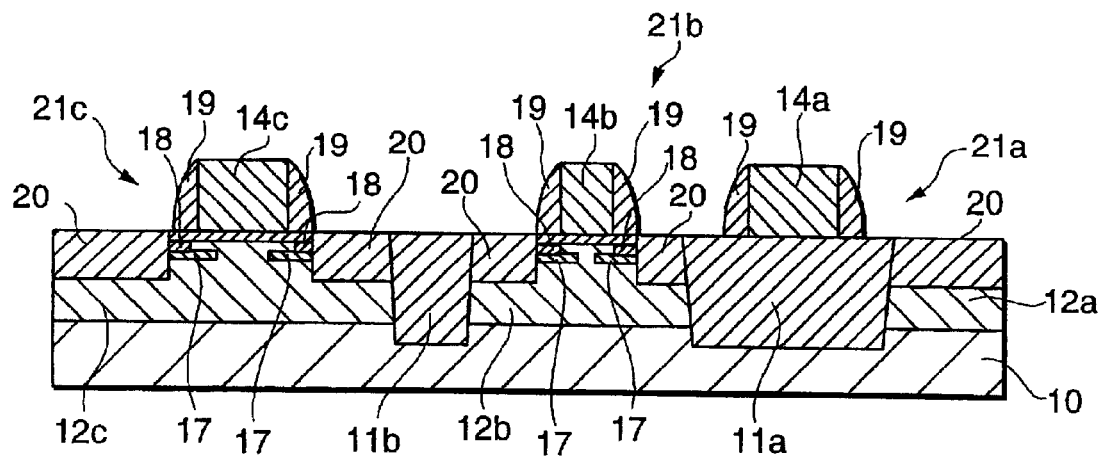

After the side walls 19 have been formed on each of the gate electrodes 14a, 14b and 14c, by using them as the selective masks, as is conventionally well known, for example, arsenic being the n-type impurity for the source and drain and having the conductive property from that of the semiconductor substrate 10 is implanted into both the sides of each of gates on the semiconductor substrate 10. As shown in FIG. 1(e), by the implantation of the impurity, impurity regions 20 for the source and drain are formed on both sides of each gate electrodes (14a, 14b and 14c) in a manner so as to correspond to each of the gate electrodes 14a, 14b and 14c. Then, heat-processing is performed on the semiconductor substrate 10 for activation of each of the impurity regions and, as a result, each of nMOS transistors 21 (21a, 21b and 21c) is formed.

In each of the nMOS transistors 21 (21a, 21b and 21c) manufactured by the method of the present invention, since the implantation to form the second impurity region 17 exhibiting the conductive property being different from that of the first impurity region 20 between the first impurity regions 20 for the source and drain is performed, as described above, before the formation of each of the gate electrodes 14a, 14b and 14c, even if the implantation is performed by using the oblique ion implantation method to be made at the same angle θ of implanting the ion as employed in the conventional method, the impurity regions 17 are formed in the direction that they come closer to one other and they can expand longer, beneath the gate electrodes (14a, 14b and 14c) of each of the transistors, compared with the FET manufactured by the conventional method.

Therefore, even if the impurity concentration in each of the impurity regions 17 is set at the same level as set in the conventional method, the expansion of the depletion layer expanding between the first impurity regions 20 can be more effectively inhibited by the second impurity regions 17 and, as a result, the decrease in the threshold value Vth of each of the transistors caused by the excessive expansion of the depletion layer can be effectively prevented.

Moreover, since the second impurity regions 17 can be expanded longer beneath each of the gate electrodes (14) compared with the conventional case, the impurity concentration of each of the impurity regions 17 can be lowered without causing the decrease in effects of inhibiting the expansion of the depletion layer.

Therefore, in each of the NMOS transistors 21 (21a, 21b and 21c) manufactured by the method of the present invention, by controlling the gate voltage to be applied to each of the gate electrodes (14a, 14b and 14c) with the voltage being applied between the source and drain, the drain current can be properly calibrated at the appropriate threshold voltage Vth.

In the above first embodiment, an example is shown in which the oblique ion implantation method to be made at the angle of the implantation being not zero (0) is employed for the ion implantation for the formation of the second impurity region 17, however, in the following second and third embodiments, a right-angled ion implantation to be performed at the angle of the implantation being zero (0) can be employed.

Second Embodiment

Figure 2A:
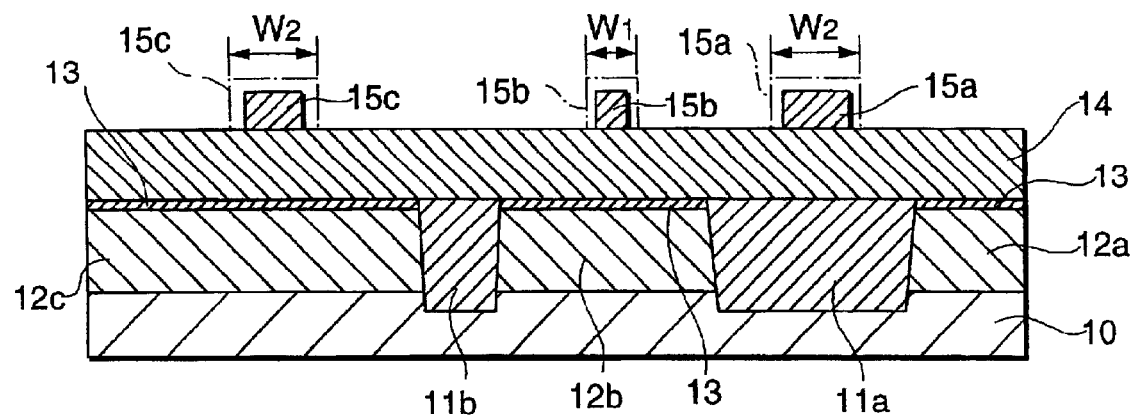
FIG. 2(a)–FIG. 2(d) show a process diagram explaining a method for manufacturing an FET according to a second embodiment of the present invention.

As shown in FIG. 2(a), as in the case of the first embodiment shown in FIG. 1(b), on the semiconductor substrate 10, active regions 12 (12a, 12b and 12c) are partitioned by element separating regions 11 (11a and 11b) and on the active regions is formed a gate oxide film 13. On the gate oxide film 13 and the element separating regions 11 is formed a conductive layer 14 to cover these films 13 and regions 11 and on the conductive layer are formed etching masks 15 (15a, 15b and 15c) for gate electrodes.

In the second embodiment, a width of each of the etching masks 15 shown in FIG. 2(a) is set so as to be smaller than a desired gate length (W1 or W2).

That is, when the desired gate lengths W1 and W2 have, for example, 0.16 μm to 0.28 μm, respectively, the etching masks 15a and 15b having a width of, for example, 0.12 μm to 0.14 μm and 0.24 μm to 0.26 μm, respectively, are formed.

As shown by virtual lines in FIG. 2(a), the etching masks 15a and 15b having a width of, for example, 0.12 μm to 0.14 μm and 0.24 μm to 0.26 μm, respectively, can be obtained by forming the etching masks having the width of, for example, 0.16 μm to 0.28 μm being the desired gate lengths W1 and W2 on the conductive layer 14 and then by performing etching on these entire etching masks 15 using an isotropic etching solution.

Alternatively, the etching masks 15a and 15b having the width of 0.12 μm to 0.14 μm and 0.24 μm to 0.26 μm, respectively, may be formed directly on the conductive layer 14.

By using the etching mask 15 having the width being less than the desired gate length W1 and W2, the impurity such as boron is implanted by the ion implanting method which causes a pair of the same second impurity regions 17 as described above to be formed beneath each of the masks 15.

Figure 2B:
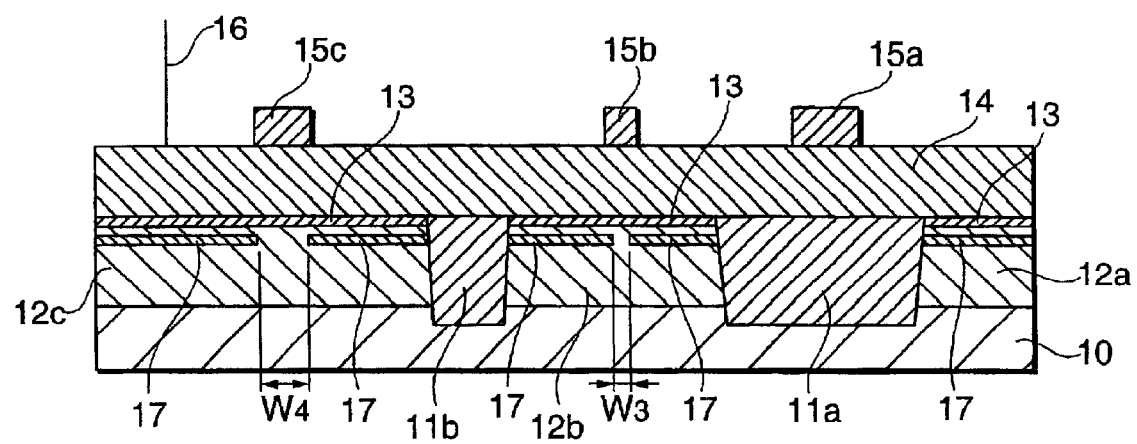

In the second embodiment, as shown in FIG. 2(b), since each of the etching masks 15 has the width being less than the desired gate length W1 and W2, the impurity can be implanted from a direction perpendicular to the semiconductor substrate 10 along a vertical line on a surface of the semiconductor substrate 10. By performing the right-angle ion implanting, each of the pair of the second impurity regions 17 is formed, by an action of the mask 15, so that an end of one impurity region making up the pair of second impurity regions 17 is disposed apart by a distance of the width W3 or W4 from an end of the other impurity region making.

If the width of the etching masks 15a and 15b is, for example, 0.12 μm to 0.14 μm and 0.24 μm to 0.26 μm, respectively, the interval being the width of W3 or W4 between ends of one impurity region and the other impurity region making up the pair of second impurity regions 17 corresponding to each mask is, for example, 0.1 μm and 0.25 μm, respectively.

Figure 2C:
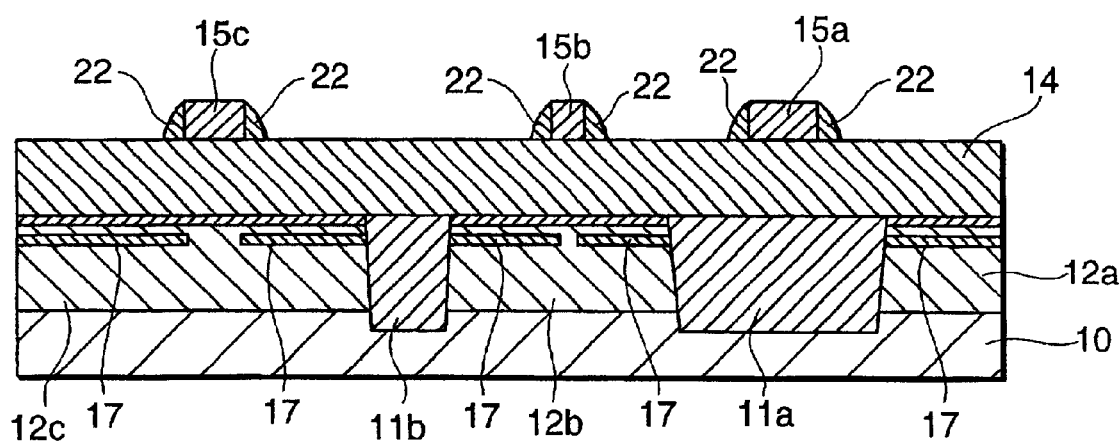

After the pairs of the impurity regions 17 have been collectively formed in a manner to correspond to every etching mask 15, insulating material layers having a thickness being equivalent to a half of a difference between the widths of each of the etching mask 15 are stacked in a manner to cover each of the etching masks 15 and then, by performing etching processing on the stacked insulating material layer, side walls 22 are formed on both sides of each of the etching mask 15, as shown in FIG. 2(c).

A width of each of the etching masks 15, when the side wall 22 is formed on both the sides, substantially becomes the width being equal to the desired gate length W1 and W2.

Figure 2D:
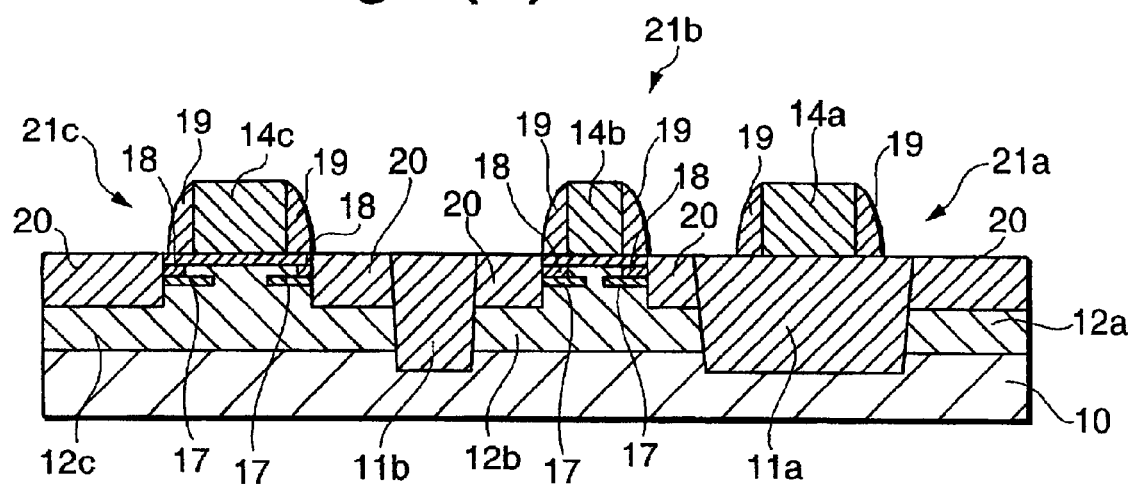

Therefore, by performing selective etching processing on the conductive layer 14 using each of the etching masks 15 having the side walls 22 in the same way as described above, as shown in FIG. 2(d), the gate electrodes 14a, 14b and 14c having the desired gate length W1 and W2 can be formed. If necessary, by performing the ion implantation using the gate electrodes 14a, 14b and 14c, LDD regions 18 as the mask are formed.

After the side walls 19 have been formed on each of the gate electrodes 14a, 14b and 14c, by the same ion implantation using these gate electrodes as the selective mask as described above, each of the impurity regions 20 for the source and drain is formed.

According to the second embodiment as shown in FIG. 2, by employing the right-angled ion implantation, not using the oblique ion implantation, the impurity regions 17 are formed, beneath the gate electrodes (14a, 14b and 14c) of each transistors 21 so that ends of each of the impurity regions 17 come closer to each other from directions of the first impurity regions 20 for the source and drain and so that the ends of each of the impurity regions 17 expand longer compared with the FET manufactured by the conventional method and therefore the excessive expansion of the depletion layer between the source and drain can be effectively inhibited and the decrease in the threshold of each of the transistors 21 can be effectively prevented.

Third Embodiment

In the second embodiment, after the second impurity has been formed by using the etching mask 15 having the width being less than the desired gate length W1 and W2, the side walls 22 are formed on each of the masks 15, however, in the third embodiment, the process of the formation of the side walls formed on each of the masks 15 is made unnecessary.

Figure 3A:
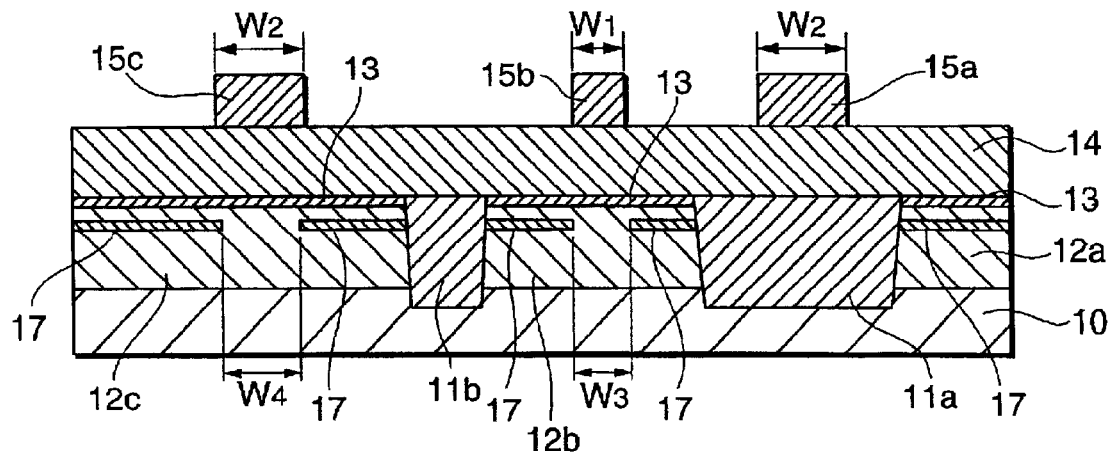
FIG. 3(a)–FIG. 3(c) show a process diagram explaining a method for manufacturing an FET according to a third embodiment of the present invention.

As shown in FIG. 3(a), as in the case of the second embodiment shown in FIG. 2(b), on the semiconductor substrate 10, active regions 12 (12a, 12b and 12c) are partitioned by element separating regions 11 (11a and 11b) and on the active regions 12 is formed the gate oxide film 13. Moreover, on the gate oxide film 13 and element separating regions 11 is formed the conductive layer 14 to cover these films 13 and regions 11 and, on the conductive layer 14 are formed etching masks 15 (15a, 15b and 15c) for the gate electrodes.

In the example shown in FIG. 3(a), as in the case of the second embodiment, a width of each of the etching masks (15a, 15b and 15c) is less than a desired gate length W1 or W2. By using the etching mask 15 having the width being less than the desired gate length W1 or W2, an impurity such as boron is implanted by the same right-angled ion implantation method as employed in the second embodiment and the same pair of second impurities 17 as described above is formed beneath each of the masks 15.

After the formation of these impurity regions 17, unwanted portions of the conductive layer 14 are removed by using a plasma etching apparatus and using each of the masks 15 as the etching mask.

Figure 3B:
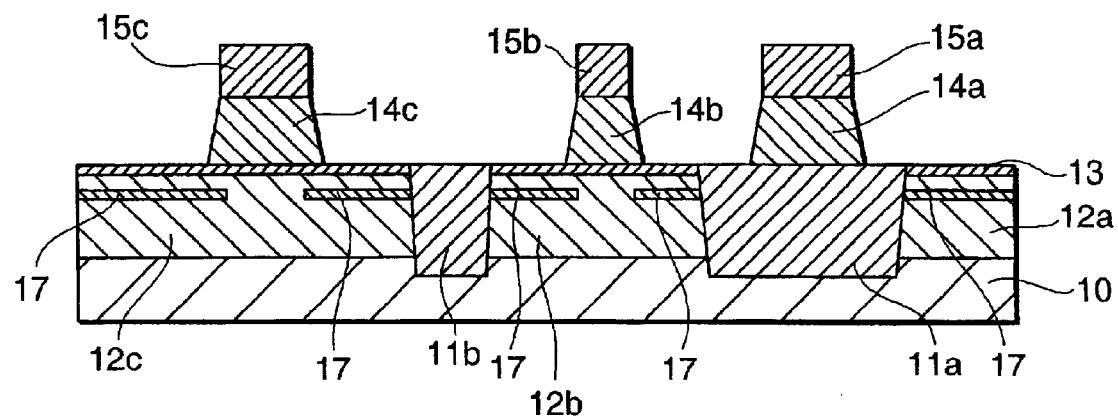

At the time of the selective etching, by changing, as appropriate, conditions for operations of the plasma etching apparatus including, for example, kinds and component ratios of etching gas, amounts (sccm) of the etching gas to be supplied to a reaction chamber or radio frequency power, as shown in FIG. 3(b), the gate electrodes 14a, 14b and 14c each having a tapered, that is, trapezoidal cross-sectional shape which causes the width of the gate electrodes 14a, 14b and 14c to increase toward a lower direction are formed beneath each of the etching masks 15. The width of a lower side of each of the gate electrodes 14a, 14b and 14c, as is apparent from the cross-sectional view, is almost equal to the desired gate length W1 or W2.

Figure 3C:
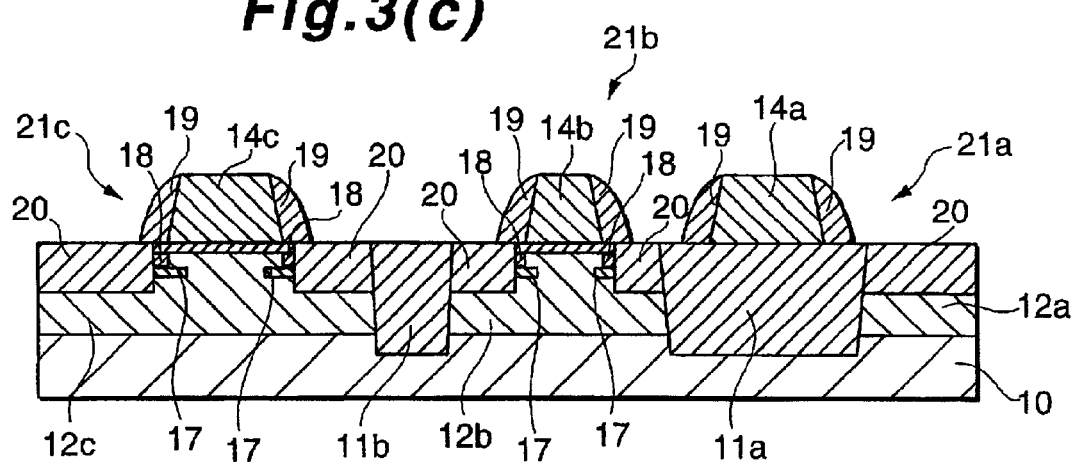

As shown in FIG. 3(c), by the ion implantation using each of the gate electrodes 14a, 14b and 14c having a trapezoidal shape as the mask, the LDD regions 18 are formed and then the side walls 19 are formed on a tilt side of each of the gate electrodes 14a, 14b and 14c. After the formation of the side walls 19, by the same ion implantation using these selective masks as describe above, each of the impurity regions 20 for the source and drain is formed.

Thus, according to the third embodiment as shown in FIG. 3, by employing the right-angled ion implantation, not using the oblique ion implantation, the impurity regions 17 are formed, beneath the gate electrodes (14a, 14b and 14c) of each transistors 21 so that ends of each of the impurity regions 17 come closer to each other from directions of the first impurity regions 20 for the source and drain and so that the ends of each of the impurity regions 17 expand longer compared with the FET manufactured by the conventional method and therefore the excessive expansion of the depletion layer between the source and the drain can be effectively inhibited and the decrease in the threshold of each of the transistors 21 can be effectively prevented. Moreover, at the time of the formation of each of the gate electrodes 14a, 14b and 14c, since the gate electrodes 14a, 14b and 14c can be formed without forming the side walls 22 on the etching masks 15, it is possible to achieve a simplification of process of manufacturing the FET.

As described above, according the present invention, prior to the formation of the gate electrode, by using the etching mask used for the formation of the gate electrode as the selective mask, the impurity is implanted for the second impurity region which serves to inhibit the expansion of the depletion layer between the source and drain. The width of the selective mask can be set to the width being less than that used to define the predetermined gate length. By the ion implantation using the selective mask, as described above, it is possible to form the second impurity regions having no variations in the width in every gate electrode and being able to expand longer beneath each of the gate electrodes compared with the conventional case. Therefore, the expansion of the depletion layer can be effectively inhibited when compared with the conventional method and the decrease in the threshold of each of the transistors caused by the excessive expansion of the deletion layer can be efficiently prevented.

It is thus apparent that the present invention is not limited to the above embodiments but may be changed and modified without departing from the scope and spirit of the invention.

What is claimed is:

1. A method of manufacturing a field effect transistor having a semiconductor substrate with a main surface, comprising:

forming a dielectric film on the main surface;

forming a conductive layer on the dielectric film;

forming a gate electrode by etching the conductive layer using a mask formed thereon;

forming a source region and a drain region in the main surface; and forming pocket regions in the semiconductor substrate by implanting ions using the mask, wherein the mask has a width less than a desired width necessary to define a gate length of the gate electrode, and the implanting is carried out from an upward direction of the mask to the semiconductor substrate using the mask.

2. A method of manufacturing a field effect transistor as recited in claim 1, wherein a dielectric spacer is formed on a side wall of the mask after the implanting, and then the gate electrode is formed by etching the conductive layer using the mask with the dielectric spacer.

3. A method of manufacturing a field effect transistor as recited in claim 1, wherein the gate electrode is formed so as to have a greater width at a bottom surface than at a top surface, after the implanting.

4. A method of manufacturing a field effect transistor as recited in claim 1, wherein the pocket regions are formed so as to underlie the gate electrode.

5. A method of manufacturing a field effect transistor as recited in claim 1, wherein said forming pocket regions comprises implanting the ions so that the pocket regions have a conductivity type opposite a conductivity type of the source and drain regions.

6. A method of manufacturing a field effect transistor as recited in claim 1, wherein said forming pocket regions comprises implanting the ions through the conductive layer into the semiconductor substrate.

7. A method of manufacturing a field effect transistor having a semiconductor substrate with a main surface, comprising:

forming a dielectric film on the main surface;

forming a conductive layer on the dielectric film;

forming a first mask on the conductive layer;

forming pocket regions in the semiconductor substrate by implanting ions using the first mask;

forming a gate electrode by etching the conductive layer using the first mask; and forming a source region and a drain region in the main surface using the gate electrode as a mask, wherein the packet regions underlie the source and drain regions, and wherein the first mask has a width less than a desired width necessary to define a gate length of the gate electrode, and the implanting is carried out from an upward direction of the first mask to the semiconductor substrate using the first mask.

8. A method of manufacturing a field effect transistor as recited in claim 7, wherein a dielectric spacer is formed on a side wall of the first mask after the implanting, and then the gate electrode is formed by etching the conductive layer using the first mask with the dielectric spacer.

9. A method of manufacturing a field effect transistor as recited in claim 7, wherein the gate electrode is formed so as to have a greater width at a bottom surface than at a top surface, after the implanting.

10. A method of manufacturing a field effect transistor as recited in claim 7, wherein the packet regions are formed so as to underlie the gate electrode.

11. A method of manufacturing a field effect transistor as recited in claim 7, wherein said forming pocket regions comprises implanting the ions so that the pocket regions have a conductivity type opposite a conductivity type of the source and drain regions.

12. A method of manufacturing a field effect transistor as recited in claim 7, wherein said forming pocket regions comprises implanting the ions through the conductive layer into the semiconductor substrate.

13. A method of manufacturing a field effect transistor including a gate electrode formed on a semiconductor substrate, a pair of first impurity regions as a source and a drain formed on both sides of said gate electrode on said semiconductor substrate, and a pair of second impurity regions formed between said pair of first impurity regions that inhibits an expansion of a depletion layer from an impurity region of said pair of first impurity regions toward another impurity region of said pair of first impurity regions, said pair of second impurity regions being formed at an interval and having a conductivity type different than a conductivity type of said pair of first impurity regions, the method comprising:

forming a conductive layer on said semiconductor substrate;

forming an etching mask on said conductive layer;

removing unwanted portions of said conductive layer using photolithography to form the gate electrode; and implanting an impurity in a predetermined region in said semiconductor substrate under said conductive layer by an ion implantation using said etching mask as a mask, to form said pair of second impurity regions, wherein said etching mask has a width less than a desired width necessary to define a gate length of said gate electrode, and wherein the impurities are implanted from an upward direction of said etching mask into said semiconductor substrate at a right angle to a line that is parallel to a surface of said semiconductor substrate.

14. The method of manufacturing a field effect transistor according to claim 13, wherein side walls are formed on said etching mask after said implanting to substantially correspond to said gate length of said gate electrode, and by using said etching mask including said side walls as a resist mask, the unwanted portions are removed from said conductive layer and said gate electrode having said gate length is formed.

15. The method of manufacturing a field effect transistor according to claim 13, wherein after said implanting using said etching mask, said gate electrode is formed as having a width that is increased along a downward direction to have said gate length by an etching process using said etching mask as a resist mask.

16. A method of manufacturing a field effect transistor according to claim 13, wherein said implanting an impurity comprises ion implantation through the conductive layer.

17. A method of manufacturing a field effect transistor comprising:

forming a conductive layer over a substrate;

forming an etching mask on the conductive layer;

implanting ions through the conductive layer into the substrate under the etching mask;

removing portions of the conductive layer using the etching mask to form a gate electrode, after said implanting;

forming side walls on the gate electrode; and implanting ions into the substrate using the gate electrode including the side walls as a mask, to form source and drain regions.

18. The method of manufacturing a field effect transistor of claim 17, wherein the ions are implanted at an oblique angle with respect to a surface of the conductive layer.

19. The method of manufacturing a field effect transistor of claim 17, wherein the ions implanted through the conductive layer into the substrate under the etching mask have a first conductivity type, and the source and drain regions have a second conductivity type opposite the first conductivity type.

* * * * *